United States Patent
Hyung et al.

(10) Patent No.: US 8,828,282 B2
(45) Date of Patent: Sep. 9, 2014

(54) PHOTOSENSITIVE RESIN COMPOSITION FOR COLOR FILTER AND COLOR FILTER USING THE SAME

(71) Applicant: Cheil Industries Inc., Gumi-si (KR)

(72) Inventors: Kyung-Hee Hyung, Uiwang-si (KR); Nam-Gwang Kim, Uiwang-si (KR); Se-Young Choi, Uiwang-si (KR); Yu-Jin Lee, Uiwang-si (KR); Gyu-Seok Han, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 14/040,898

(22) Filed: Sep. 30, 2013

(65) Prior Publication Data
US 2014/0183425 A1 Jul. 3, 2014

(30) Foreign Application Priority Data
Dec. 28, 2012 (KR) .................. 10-2012-0157574

(51) Int. Cl.
| | | |
|---|---|---|
| *F21V 9/00* | (2006.01) | |
| *G02B 5/02* | (2006.01) | |
| *G02C 7/10* | (2006.01) | |
| *G02F 1/361* | (2006.01) | |
| *G03B 11/00* | (2006.01) | |
| *G02B 5/23* | (2006.01) | |
| *G03C 1/00* | (2006.01) | |
| *G03F 7/00* | (2006.01) | |
| *G02F 1/1335* | (2006.01) | |

(52) U.S. Cl.
CPC .................. *G03F 7/0007* (2013.01); *Y10S 430/106* (2013.01)
USPC ...... 252/582; 252/301.35; 252/586; 349/106; 359/891; 430/7; 430/270.1; 430/281.1; 430/286.1; 430/311; 430/396; 430/905

(58) Field of Classification Search
USPC .......... 252/586, 301.35, 582; 430/5, 7, 270.1, 430/281.1, 286.1, 311, 396, 905; 522/18, 522/74, 184; 349/106; 359/891
See application file for complete search history.

(56) References Cited

U.S. PATENT DOCUMENTS

| | | | |
|---|---|---|---|
| 5,346,545 A | 9/1994 | Chassot | |
| 5,998,091 A | 12/1999 | Suzuki | |
| 7,611,826 B2 * | 11/2009 | Yang et al. | 430/311 |
| 2012/0138858 A1 * | 6/2012 | Lee et al. | 252/301.35 |

FOREIGN PATENT DOCUMENTS

| | | |
|---|---|---|
| JP | 06-041458 | 2/1994 |
| JP | 07-049412 | 2/1995 |
| JP | 07-140654 | 6/1995 |
| JP | 10-254133 | 9/1998 |
| JP | 2005-173287 | 6/2005 |
| JP | 2011-145540 | 7/2011 |
| KR | 10-0309901 B2 | 9/2001 |
| KR | 10-2010-0080141 A | 7/2010 |
| KR | 10-2011-0072947 A | 6/2011 |
| KR | 10-2011-0126393 A | 11/2011 |
| KR | 10-2012-0059929 A | 6/2012 |
| WO | 94/18274 | 8/1994 |

* cited by examiner

*Primary Examiner* — Bijan Ahvazi
(74) *Attorney, Agent, or Firm* — Additon, Higgins & Pendleton, P.A.

(57) ABSTRACT

Disclosed are a photosensitive resin composition for a color filter including (A) a colorant including a dye represented by the following Chemical Formula 1 and/or a dye represented by the following Chemical Formula 2, wherein in the following Chemical Formulae 1 and 2, each substituent is the same as described in the detailed description; (B) an acrylic-based binder resin; (C) a photopolymerizable monomer; (D) a photopolymerization initiator; and (E) a solvent, and a color filter using the same.

[Chemical Formula 1]

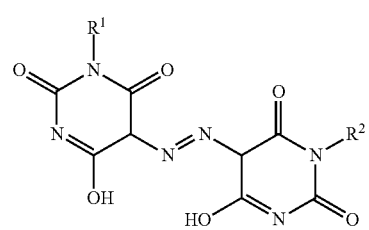

[Chemical Formula 2]

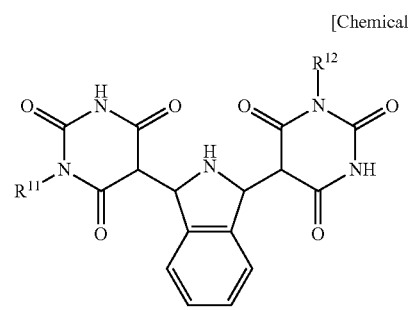

5 Claims, No Drawings

PHOTOSENSITIVE RESIN COMPOSITION FOR COLOR FILTER AND COLOR FILTER USING THE SAME

CROSS-REFERENCE TO RELATED APPLICATION

This application claims priority to and the benefit of Korean Patent Application No. 10-2012-0157574 filed in the Korean Intellectual Property Office on Dec. 28, 2012, the entire disclosure of which is incorporated herein by reference.

FIELD OF THE INVENTION

This disclosure relates to a photosensitive resin composition for a color filter and a color filter using the same.

BACKGROUND OF THE INVENTION

A liquid crystal display among many kinds of displays has an advantage of lightness, thinness, low cost, low power consumption for operation, and improved adherence to an integrated circuit and is widely used for laptop computers, monitors, and TV screens.

A liquid crystal display is equipped with a color filter formed by repeating a unit pixel, in which three primary color sub-pixels of red (R), green (G), and blue (B) are combined.

The unit pixel displays a particular color due to the combination of three primary colors when each sub-pixel is adjacently disposed and a color signal is applied to control brightness.

The color filter is made of red (R), green (G), and blue (B) color dyes or pigments. These color materials play a role of changing a white light from a backlight unit into each corresponding color light.

When the color materials have a spectrum with no unnecessary wavelength other than a required absorption wavelength and a smaller absorption band, display performance of the color filter may be improved.

In addition, the color materials are required to have excellent heat resistance, light resistance, and chemical resistance without being faded or discolored when exposed to various conditions such as ultraviolet (UV) radiation, acids, and bases during etching of a color resist.

The color filter can be fabricated using a photosensitive resin composition through various methods such as dyeing, electrophoretic deposition (EPD), printing, pigment dispersion, and the like, in which three or more colors are coated on a transparent substrate.

Recently, the pigment dispersion method has been improved. The pigment dispersion method can provide improved color reproducibility and durability for heat, light, and humidity and thus is becoming more widely adopted.

However, when a pigment-type photosensitive resin composition is used to fabricate a color filter, the color filter can exhibit deteriorated luminance and contrast ratio due to the size and cohesion of pigment particles. To address these problems, there has been research directed to developing a photosensitive resin composition including a dye that is not in the form of particles or has a smaller primary particle diameter than a pigment dispersion. However, dye-type photosensitive resin compositions can have poor heat resistance, light resistance, and chemical resistance and are still not widely commercially available.

Accordingly, there is a need to improve the reliability of the dye-type photosensitive resin composition for commercial availability.

SUMMARY OF THE INVENTION

One embodiment of the present invention provides a photosensitive resin composition for a color filter that can have high transmittance, luminance, and contrast ratio, and improved heat resistance and coloring performance.

Another embodiment of the present invention provides a color filter manufactured using the photosensitive resin composition for a color filter.

In one embodiment of the present invention, a photosensitive resin composition for a color filter includes (A) a colorant including a dye represented by the following Chemical Formula 1, a dye represented by the following Chemical Formula 2, or a combination thereof; (B) an acrylic-based binder resin; (C) a photopolymerizable monomer; (D) a photopolymerization initiator; and (E) a solvent.

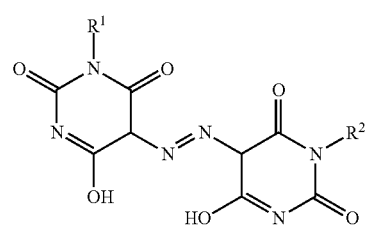

[Chemical Formula 1]

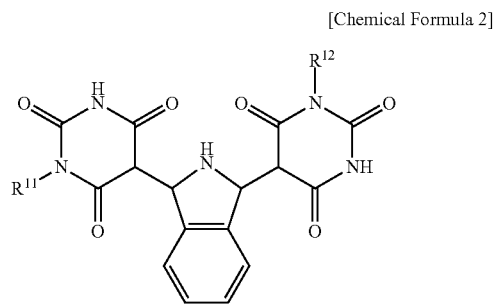

[Chemical Formula 2]

In the above Chemical Formula 1 and Chemical Formula 2, $R^1$, $R^2$, $R^{11}$ and $R^{12}$ are the same or different and are each independently hydrogen, substituted or unsubstituted C1 to C20 alkyl, substituted or unsubstituted C1 to C20 haloalkyl, substituted or unsubstituted C1 to C20 alkoxy, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, substituted or unsubstituted C2 to C30 heteroaryl, or substituted or unsubstituted C2 to C20 ester group, wherein at least one of $R^1$ and $R^2$ is $—C(=O)OR^3$, wherein at least one of $R^{11}$ and $R^{12}$ is $—C(=O)OR^{13}$, and $R^3$ and $R^{13}$ are the same or different and are each independently substituted or unsubstituted C1 to C20 alkyl, substituted or unsubstituted C1 to C20 haloalkyl, substituted or unsubstituted C1 to C20 alkoxy, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl.

The colorant (A) may further include a pigment.

The colorant (A) may include a dye and a pigment in a weight ratio of about 1:9 to about 9:1.

The photosensitive resin composition for a color filter may include about 0.1 to about 60 wt % of the colorant (A); about 0.1 to about 30 wt % of the acrylic-based binder resin (B); about 0.1 to about 30 wt % of the photopolymerizable monomer (C); about 0.1 to about 10 wt % of the photopolymerization initiator (D); and a balance amount of the solvent (E).

Another embodiment of the present invention provides a color filter manufactured using the photosensitive resin composition for a color filter.

Other embodiments of the present invention are included in the following detailed description.

The photosensitive resin composition for a color filter can have high transmittance and contrast ratio, and thus can provide a color filter that can have improved heat resistance and coloring performance.

DETAILED DESCRIPTION

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "substituted" may refer to one substituted with halogen (F, Cl, Br, I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid group or a salt thereof, C1 to C20 alkyl, C2 to C20 alkenyl, C2 to C20 alkynyl, C6 to C30 aryl, C3 to C20 cycloalkyl, C3 to C20 cycloalkenyl, C3 to C20 cycloalkynyl, C2 to C20 heterocycloalkyl, C2 to C20 heterocycloalkenyl, C2 to C20 heterocycloalkynyl, or a combination thereof, in place of at least one hydrogen of a compound.

As used herein, when a specific definition is not otherwise provided, the terms "heterocycloalkyl", "heterocycloalkenyl", "heterocycloalkynyl" and "heterocycloalkylene" refer to cycloalkyl, cycloalkenyl, cycloalkynyl and cycloalkylene cyclic compound, respectively, including a heteroatom including N, O, S, P, or a combination thereof in place of a hydrogen atom.

As used herein, when a specific definition is not otherwise provided, "(meth)acrylate" refers to both "acrylate" and "methacrylate".

A photosensitive resin composition for a color filter according to one embodiment includes (A) a colorant including a dye represented by Chemical Formula 1, a dye represented by Chemical Formula 2 or a combination thereof; (B) an acrylic-based binder resin; (C) a photopolymerizable monomer; (D) a photopolymerization initiator; and (E) a solvent.

Hereinafter, each component is described in detail.

(A) Colorant

The colorant includes a dye represented by Chemical Formula 1 and/or a dye represented by Chemical Formula 2. In this case, the photosensitive resin composition for a color filter can ensure characteristics of high transmittance, and a high contrast ratio and can simultaneously exhibit heat resistance properties.

[Chemical Formula 1]

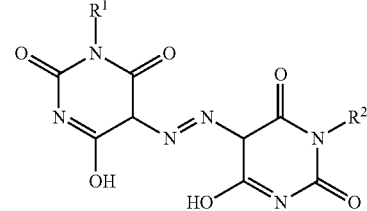

In the above Chemical Formula 1, $R^1$ and $R^2$ are the same or different and are each independently hydrogen, substituted or unsubstituted C1 to C20 alkyl, substituted or unsubstituted C1 to C20 haloalkyl, substituted or unsubstituted C1 to C20 alkoxy, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, substituted or unsubstituted C2 to C30 heteroaryl, or substituted or unsubstituted C2 to C20 ester group.

At least one of $R^1$ and $R^2$ is a substituted or unsubstituted C2 to C20 ester group. That is to say, at least one of $R^1$ and $R^2$ is $-C(=O)OR^3$.

$R^3$ is substituted or unsubstituted C1 to C20 alkyl, substituted or unsubstituted C1 to C20 haloalkyl, substituted or unsubstituted C1 to C20 alkoxy, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl.

$R^1$ and $R^2$ may be the same or different from each other.

When one of $R^1$ and $R^2$ is $-C(=O)OR^3$, the other may be, for example hydrogen, substituted or unsubstituted C1 to C20 alkyl, substituted or unsubstituted C3 to C20 cycloalkyl, or substituted or unsubstituted C6 to C30 aryl.

[Chemical Formula 2]

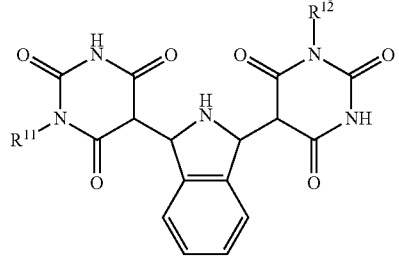

In the above Chemical Formula 2, $R^{11}$ and $R^{12}$ are the same or different and are each independently hydrogen, substituted or unsubstituted C1 to C20 alkyl, substituted or unsubstituted C1 to C20 haloalkyl, substituted or unsubstituted C1 to C20 alkoxy, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, substituted or unsubstituted C2 to C30 heteroaryl, or substituted or unsubstituted C2 to C20 ester group.

At least one of $R^{11}$ and $R^{12}$ is a substituted or unsubstituted C2 to C20 ester group.

$R^{11}$ and $R^{12}$ may be the same or different from each other.

When at least one of $R^{11}$ and $R^{12}$ is —C(=O)OR$^{13}$, and one is —C(=O)OR$^{13}$, the other may be, for example hydrogen, substituted or unsubstituted C1 to C20 alkyl, substituted or unsubstituted C3 to C20 cycloalkyl, or substituted or unsubstituted C6 to C30 aryl.

$R^{13}$ is substituted or unsubstituted C1 to C20 alkyl, substituted or unsubstituted C1 to C20 haloalkyl, substituted or unsubstituted C1 to C20 alkoxy, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl.

The compound represented by the above Chemical Formula 1 and the compound represented by the above Chemical Formula 2 are a yellow dye, and may be used as a colorant with a green dye and/or a red dye.

When a soluble dye is used instead of an insoluble pigment as a colorant in the photosensitive composition for a color filter, light scattering phenomenon can be deteriorated due to high solubility and the composition can provide characteristics of high transmittance and a high contrast ratio. However, when a monomolecular dye is used, the monomolecular dye can have a larger molecular movement due to heat treatment and may be irregularly cohered and thus, can have a drawback of deteriorated heat resistance.

Dyes represented by the above Chemical Formulae 1 and 2 are monomolecular dyes but are converted into pigments after heat treatment and regularly arranged through a hydrogen bond among molecules and thus, may be prevented from irregular cohesion and overcome weak thermal properties.

In other words, a photosensitive resin composition for a color filter according to one embodiment and a color filter including the photosensitive resin composition for a color filter may realize high transmittance and high contrast ratio characteristics and simultaneously, thermal resistance properties.

The dyes represented by the above Chemical Formulas 1 and 2 may have a solubility of greater than or equal to about 5 in a post-described solvent (E), for example a solubility ranging from about 5 to about 10. The solubility may be obtained by the amount (g) of the dye dissolved in 100 g of the solvent. When the dye has a solubility within the above range, a photosensitive resin composition for a color filter according to one embodiment may be compatible with other components and precipitation of a dye may be prevented.

Examples of the solvent may include without limitation propylene glycol monomethylether acetate (PGMEA), ethyl lactate (EL), ethylene glycol ethyl acetate (EGA), cyclohexanone, and the like, and combinations thereof.

The dye represented by the above Chemical Formula 1 and the dye represented by the above Chemical Formula 2 have high heat resistance. That is to say, the dye represented by the above Chemical Formula 1 and/or the dye represented by the above Chemical Formula 2 can have a thermal decomposition temperature measured by thermogravimetric analyzer (TGA) greater than or equal to about 200° C., for example about 200 to about 400° C.

The dye having these characteristics may be used in color filters of LCDs, LEDs, and the like that can exhibit a high luminance and a high contrast ratio at desired color coordinates.

The colorant (A) may further include a pigment. Accordingly, luminance and contrast ratio may be furthermore improved.

The pigment may be a green, red, blue, and/or yellow pigment.

Examples of the green pigment may include without limitation C.I. green pigment 36, C.I. green pigment 7, C.I. green pigment 58, and the like of a color index (C.I.). The pigment may be used singularly or in a mixture thereof, but is not limited thereto.

Examples of the red pigment include without limitation C.I. pigment red 242, C.I. pigment red 214, C.I. pigment red 221, C.I. pigment red 166, C.I. pigment red 220, C.I. pigment red 248, C.I. pigment red 262, C.I. pigment red 254, C.I. pigment red 177, and the like, and may be used singularly or as a mixture of two or more.

Examples of the blue pigment may include without limitation copper phthalocyanine pigments such as C.I. blue pigment 15:6, C.I. blue pigment 15, C.I. blue pigment 15:1, C.I. blue pigment 15:2, C.I. blue pigment 15:3, C.I. blue pigment 15:4, C.I. blue pigment 15:5, C.I. blue pigment 16, and the like. The pigment may be used singularly or in a mixture thereof, but is not limited thereto.

Examples of the yellow pigment may include without limitation isoindoline-based pigments such as C.I. yellow pigment 139, quinophthalone-based pigments such as C.I. yellow pigment 138, nickel complex pigments such as C.I. yellow pigment 150, and the like. The pigment may be used singularly or in a mixture thereof, but is not limited thereto.

The pigment may be included in the photosensitive resin composition in a form of dispersion. The pigment dispersion may include a solvent, a dispersing agent, and the like as well as the pigment.

Examples of the solvent may include without limitation ethylene glycol acetate, ethyl cellosolve, propylene glycol methyl ether acetate, ethyl lactate, polyethylene glycol, cyclohexanone, propylene glycol methyl ether, and the like, and combinations thereof. In exemplary embodiments propylene glycol methyl ether acetate may be used.

The dispersing agent can help uniformly disperse the pigment. Examples of the dispersing agent may include non-ionic, anionic, and/or cationic dispersing agents. Examples of the dispersing agent may include without limitation polyalkylene glycols or an ester thereof, polyoxy alkylenes, polyhydric alcohol ester alkylene oxide addition products, alcohol alkylene oxide addition products, sulfonate esters, sulfonate salts, carboxylate esters, carboxylate salts, alkyl amide alkylene oxide addition products, alkyl amines, and the like. They may be used singularly or as a mixture of two or more.

When the colorant further includes the pigment, a weight ratio of the dye and pigment may be about 1:9 to about 9:1, for example about 3:7 to about 7:3.

In some embodiments, the mixture of the pigment and the dye can include the pigment in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the pigment can be in a range from about any of the foregoing amounts to about any other of the foregoing amounts.

In some embodiments, the mixture of the pigment and the dye can include the dye in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the dye can be in a range from about any of the foregoing amounts to about any other of the foregoing amounts.

When the pigment and the dye are used in a weight ratio within the above range, high luminance and contrast ratio may be obtained while color characteristics can be maintained.

The photosensitive resin composition can include the colorant (A) in an amount of about 0.1 to about 60 wt %, for example about 5 to about 50 wt %, based on the total amount (100 wt %) of the photosensitive resin composition for a color filter. In some embodiments, the photosensitive resin composition can include the colorant (A) in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, or 60 wt %. Further, according to some embodiments of the present invention, the amount of the colorant (A) can be in a range from about any of the foregoing amounts to about any other of the foregoing amounts.

When the colorant (A) is used in an amount within the above range, high luminance and contrast ratio may be obtained at a desired color coordinate.

(B) Acrylic-Based Binder Resin

The acrylic-based binder resin is a copolymer of a first ethylenic unsaturated monomer and a second ethylenic unsaturated monomer that is copolymerizable therewith, and is a resin including at least one acrylic-based repeating unit.

The first ethylenic unsaturated monomer is an ethylenic unsaturated monomer including at least one carboxyl group. Examples of the monomer include without limitation acrylic acid, methacrylic acid, maleic acid, itaconic acid, fumaric acid, and the like and combinations thereof.

The acrylic-based binder resin may include the first ethylenic unsaturated monomer in an amount ranging from about 5 to about 50 wt %, for example about 10 to about 40 wt %, based on the total amount (100 wt %) of the acrylic-based binder resin. In some embodiments, the acrylic-based resin may include the first ethylenic unsaturated monomer in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 wt %. Further, according to some embodiments of the present invention, the amount of the first ethylenic unsaturated mono-mer can be in a range from about any of the foregoing amounts to about any other of the foregoing amounts.

Examples of the second ethylenic unsaturated monomer may include without limitation aromatic vinyl compounds such as styrene, α-methylstyrene, vinyltoluene, vinylbenzylmethylether, and the like; unsaturated carboxylate ester compounds such as methyl(meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl (meth)acrylate, phenyl(meth)acrylate, and the like; unsaturated carboxylic acid amino alkyl ester compounds such as 2-aminoethyl(meth)acrylate, 2-dimethylaminoethyl(meth)acrylate, and the like; carboxylic acid vinyl ester compounds such as vinyl acetate, vinyl benzoate, and the like; unsaturated carboxylic acid glycidyl ester compounds such as glycidyl (meth)acrylate and the like; vinyl cyanide compounds such as (meth)acrylonitrile and the like; unsaturated amide compounds such as (meth)acrylamide and the like; and the like, and may be used singularly or as a mixture of two or more.

Specific examples of the acrylic-based binder resin may include without limitation methacrylic acid/benzylmethacrylate copolymer, a methacrylic acid/benzyl methacrylate/styrene copolymer, a methacrylic acid/benzylmethacrylate/2-hydroxyethylmethacrylate copolymer, a methacrylic acid/benzylmethacrylate/styrene/2-hydroxyethylmethacrylate copolymer, and the like. These may be used singularly or as a mixture of two or more.

The acrylic-based binder resin may have a weight average molecular weight of about 3,000 to about 150,000 g/mol, for example about 5,000 to about 50,000 g/mol, and as another example about 20,000 to about 30,000 g/mol. When the acrylic-based binder resin has a weight average molecular weight within the above range, the composition may have an excellent close contacting (adhesive) property with a substrate, good physical and chemical properties, and appropriate viscosity.

The acrylic-based binder resin may have an acid value ranging from about 15 to about 60 mgKOH/g, for example about 20 to about 50 mgKOH/g. When the acrylic-based binder resin has an acid value within the above range, excellent pixel resolution may be obtained.

The photosensitive resin composition may include the acrylic-based binder resin in an amount ranging from about 0.1 to about 30 wt %, for example about 5 to about 20 wt %, based on the total amount (100 wt %) of the photosensitive resin composition for a color filter. In some embodiments, the photosensitive resin composition may include the acrylic-based binder resin in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the acrylic-based binder resin can be in a range from about any of the foregoing amounts to about any other of the foregoing amounts.

When the acrylic-based binder resin is included in an amount within the above range, developability can be improved during manufacture of a color filter, and excellent surface planarization may be obtained due to improved crosslinking.

(C) Photopolymerizable Monomer

The photopolymerizable monomer may be a multi-functional monomer having two or more hydroxy groups. Specific examples of the photopolymerizable monomer may include without limitation glycerolacrylate, dipentaerythritolhexaacrylate, ethylene glycoldiacrylate, triethylene glycoldiacrylate, 1,4-butanedioldiacrylate, 1,6-hexanedioldiacrylate, neopentylglycoldiacrylate, pentaerythritoldiacrylate, pentaerythritoltriacrylate, dipentaerythritoltriacrylate, dipentaerythritolacrylate, pentaerythritolhexaacrylate, bisphenol A diacrylate, trimethylol propanetriacrylate, novolacepoxyacrylate, ethylene glycol dimethacrylate, diethylene glycoldimethacrylate, triethylene glycoldimethacrylate, propylene glycoldimethacrylate, 1,4-butanedioldimethacrylate, 1,6-hexanedioldimethacrylate, and the like, and combinations thereof.

The photosensitive resin composition may include the photopolymerizable monomer in an amount of about 0.1 to about 30 wt %, for example about 5 to about 20 wt %, based on the total amount (100 wt %) of photosensitive resin composition for a color filter. In some embodiments, the photosensitive resin composition may include the photopolymerizable monomer in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the photopolymerizable monomer can be in a range from about any of the foregoing amounts to about any other of the foregoing amounts.

When the photopolymerizable monomer is included in an amount within the above range, pattern characteristics and developability can be improved during manufacture of a color filter.

(D) Photopolymerization Initiator

The photopolymerization initiator can be any conventional or generally-used photopolymerization initiator for a photosensitive resin composition for a color filter. Examples of photopolymerization initiators may include without limitation acetophenone-based compounds, benzophenone-based compounds, thioxanthone-based compounds, benzoin-based compounds, triazine-based compounds, oxime-based compounds, and the like, and combinations thereof.

Examples of the acetophenone-based compound may include without limitation 2,2'-diethoxyacetophenone, 2,2'-dibutoxyacetophenone, 2-hydroxy-2-methylpropiophenone, p-t-butyltrichloroacetophenone, p-t-butyldichloroacetophenone, 4-chloroacetophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butan-1-one, and the like, and combinations thereof.

Examples of the benzophenone-based compound may include without limitation benzophenone, benzoyl benzoic acid, benzoyl benzoic acid methyl, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone,4,4'-dichlorobenzophenone, 3,3'-dimethyl-2-methoxybenzophenone, and the like, and combinations thereof.

Examples of the thioxanthone-based compound may include without limitation thioxanthone, 2-methylthioxanthone, isopropyl thioxanthone, 2,4-diethyl thioxanthone, 2,4-diisopropyl thioxanthone, 2-chlorothioxanthone, and the like, and combinations thereof.

Examples of the benzoin-based compound may include without limitation benzoin, benzoin methyl ether, benzoin ethyl ether, benzoin isopropyl ether, benzoin isobutyl ether, benzyldimethylketal, and the like, and combinations thereof.

Examples of the triazine-based compound may include without limitation 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl 4,6-bis(trichloro methyl)s-triazine, bis(trichloromethyl)-6-styryl-s-triazine, 2-(naphtha-1-yl)-4,6-bis(trichloromethyl)-s-triazine, 2-(4-methoxynaphthol-yl)-4,6-bis(trichloromethyl)-s-triazine, 2-4-tri chloromethyl(piperonyl)-6-triazine, 2-4-trichloromethyl (4'-methoxystyryl)-6-triazine, and the like, and combinations thereof.

Examples of the oxime-based compound may include without limitation 2-(o-benzoyloxime)-1-[4-(phenylthio) phenyl]-1,2-octandione, 1-(o-acetyloxime)-1-[9-ethyl-6-(2-methylbenzoyl)-9H-carbazol-3-yl]ethanone, and the like, and combinations thereof.

A carbazole-based compound, a diketone compound, a sulfonium borate-based compound, a diazo-based compound, a biimidazole-based compound, and the like and combinations thereof may be also used as a photopolymerization initiator, in addition to or instead of the above-described photopolymerization initiators.

The photosensitive resin composition may include the photopolymerization initiator in an amount of about 0.1 to about 10 wt %, for example about 1 to about 5 wt %, based on the total amount (100 wt %) of the photosensitive resin composition for a color filter. In some embodiments, the photosensitive resin composition may include the photopolymerization initiator in an amount of about 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of the photopolymerization initiator can be in a range from about any of the foregoing amounts to about any other of the foregoing amounts.

When the photopolymerization initiator is included in an amount within the above range, sufficient photopolymerization may be performed during exposure of a pattern-forming process, and sensitivity and transmittance can be improved.

(E) Solvent

Examples of the solvent may include, but are not limited to, alcohols such as methanol, ethanol, and the like; ethers such as dichloroethyl ether, n-butyl ether, diisoamyl ether, methylphenyl ether, tetrahydrofuran, and the like; glycol ethers such as ethylene glycol methylether, ethylene glycol ethylether, propylene glycol methylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; alkyl lactate esters such as methyl lactate, ethyl lactate and the like; alkyl hydroxyacetate esters such as methyl hydroxyacetate, ethyl hydroxyacetate, butyl hydroxyacetate and the like; alkoxyalkyl acetate esters such as methoxymethyl acetate, methoxyethyl acetate, methoxybutyl acetate, ethoxymethyl acetate, ethoxyethyl acetate, and the like; alkyl 3-hydroxypropionate esters such as methyl 3-hydroxypropionate, ethyl 3-hydroxypropionate, and the like; alkyl 3-alkoxypropionate esters such as methyl 3-methoxypropionate, ethyl 3-methoxypropionate, ethyl 3-ethoxypropionate, methyl 3-ethoxypropionate, and the like; alkyl 2-hydroxypropionate esters such as methyl 2-hydroxypropionate, ethyl 2-hydroxypropionate, propyl 2-hydroxypropionate, and the like; alkyl 2-alkoxypropionate esters such as methyl 2-methoxypropionate, ethyl 2-methoxypropionate, ethyl 2-ethoxypropionate, methyl 2-ethoxypropionate, and the like; alkyl 2-hydroxy-2-methylpropionate esters such as methyl 2-hydroxy-2-methylpropionate, ethyl 2-hydroxy-2-methylpropionate, and the like; alkyl 2-alkoxy-2-methylpropionate esters such as methyl 2-methoxy-2-methylpropionate, ethyl 2-ethoxy-2-methylpropionate, and the like; esters such as 2-hydroxyethyl propionate, 2-hydroxy-2-methylethyl propionate, hydroxyethyl acetate, methyl 2-hydroxy-3-methylbutanoate, and the like; ketonic acid esters such as ethyl pyruvate, and the like, and combinations thereof. In addition, the solvent may include N-methylformamide, N,N-dimethylformamide, N-methylformanilide, N-methylacetamide, N,N-dimethylacetamide, N-methylpyrrolidone, dimethylsulfoxide, benzylethylether, dihexylether, acetyl acetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like, and may be used singularly or as a mixture of two or more.

In exemplary embodiments, considering miscibility, reactivity, and the like, examples of the solvent may include without limitation glycol ethers such as ethylene glycol monoethyl ether, and the like; ethylene glycol alkylether acetates such as ethyl cellosolve acetate, and the like; esters such as 2-hydroxyethyl propionate, and the like; diethylene glycols such as diethylene glycol monomethyl ether, and the like; propylene glycol alkylether acetates such as propylene glycol monomethylether acetate, propylene glycol propylether acetate, and the like, and combinations thereof.

The photosensitive resin composition may include the solvent in a balance amount, for example, in an amount ranging from about 20 to about 90 wt % based on the total amount (100 wt %) of the photosensitive resin composition for a color filter. In some embodiments, the photosensitive resin composition may include the solvent in an amount of about 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the solvent can be in a range from about any of the foregoing amounts to about any other of the foregoing amounts.

When the solvent is included in an amount within the above range, the photosensitive resin composition can have improved coating properties, and excellent flatness at a thickness of 3 μm or more.

(F) Surfactant

The photosensitive resin composition for a color filter may further include a surfactant to uniformly disperse the pigment into the solvent and to improve leveling performance.

Examples of the surfactant may include without limitation fluorine-based surfactants and/or silicon-based surfactants.

Examples of the fluorine-based surfactant may include without limitation F-482, F-484, F-478, and the like, and combinations thereof made by DIC Co., Ltd.

Examples of the silicon-based surfactant may include without limitation TSF400, TSF401, TSF410, TSF4440, and the like, and combinations thereof, made by Toshiba Silicon Co., Ltd.

The surfactant may be included in an amount ranging from about 0.01 to about 5 parts by weight, for example, from about 0.1 to about 2 parts by weight, based on about 100 parts by weight of the photosensitive resin composition for a color filter. When the surfactant is included in an amount within the above range, the composition may have fewer impurities generated after the development.

(G) Other Additive(s)

The photosensitive resin composition for a color filter may further include one or more other additives. Examples of the additives may include without limitation malonic acid, 3-amino-1,2-propanediol, vinyl- and/or (meth)acryloxy-containing silane-based coupling agents, and the like, and combinations thereof, in order to prevent stains or spots during the coating, to adjust leveling, and/or to prevent pattern residue due to non-development. The amount of these additives may be adjusted depending on desired properties.

In addition, the photosensitive resin composition for a color filter may include an epoxy compound to improve the close contacting (adhesive) property and other characteristics if needed.

Examples of the epoxy compound may include without limitation epoxy novolac acryl carboxylate resins, ortho cresol novolac epoxy resins, phenol novolac epoxy resins, tetramethyl biphenyl epoxy resins, bisphenol A epoxy resins, alicyclic epoxy resins, and the like, and combinations thereof.

When the epoxy compound is included, a peroxide initiator and/or a radical polymerization initiator such as an azobis-based initiator may be additionally included.

The method of making the photosensitive resin composition for a color filter is not particularly limited, and may be prepared by mixing the above-described dye, acrylic-based binder resin, photopolymerization initiator, photopolymerizable monomer, solvent, and optionally an additive.

According to another embodiment of the present invention, provided is a color filter manufactured using the photosensitive resin composition for a color filter.

This color filter may be manufactured using any conventional or general method. In exemplary embodiments, the color filter can be manufactured by spin-coating, roller-coating, slit-coating, and the like of the photosensitive resin composition to have a thickness ranging from about 1.5 to about 2.0 μm. After coating, the layer can be radiated with a UV ray, an electron beam, or an X-ray to form a pattern required for a color filter. The UV ray may have a wavelength region ranging from about 190 to about 450 nm, for example, from about 200 to about 400 nm. Subsequently, when the coated layer is treated with an alkali developing solution, the unradiated region thereof may be dissolved, forming a pattern for an image color filter. This process can be repeated depending on the necessary number of R, G, and B colors, fabricating a color filter having a desired pattern. In addition, the image pattern acquired by the development can be cured through heat treatment, actinic ray radiation, or the like, to improve crack resistance, solvent resistance, and the like.

Hereinafter, the present invention is illustrated in more detail with reference to examples. These examples, however, are not in any sense to be interpreted as limiting the scope of the invention.

(Preparation of Photosensitive Resin Composition for Color Filter)

Photosensitive resin compositions for a color filter are prepared using the following components.

(A) Colorant
(A-1) Dye
(A-1-1) A dye represented by the following Chemical Formula 3 is used.

[Chemical Formula 3]

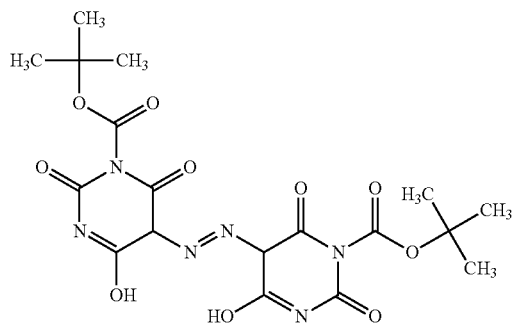

(A-1-2) A dye represented by the following Chemical Formula 4 is used.

[Chemical Formula 4]

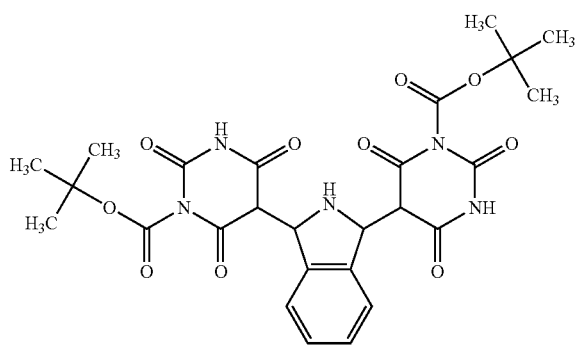

(A-2) Pigment (A-2-1) C.I. green pigment 58 is used.

(A-2-2) C.I. yellow pigment 150 is used.

(A-2-3) C.I. yellow pigment 139 is used.

(B) Acrylic-Based Binder Resin

A methacrylic acid/benzyl methacrylate copolymer resin (w/w=30/70; Miwon Commercial Co., Ltd, NPR1520) is used.

(C) Photopolymerizable Monomer
Dipentaerythritol hexaacrylate (Dainippon Ink & Chemicals Inc.) is used.
(D) Photopolymerization Initiator
CGI-124 of Ciba Specialty Chemicals Co. is used.
(E) Solvent
Propylene glycol monomethyl ether acetate is used.
(F) Surfactant
Fluorine-based surfactant (F-554_DIC Co., Ltd.) is used Examples 1 and 2 and Comparative Examples 1 and 2

A photosensitive resin composition for a color filter is prepared by mixing each component according to a composition provided in the following Table 1.

Specifically, a photopolymerization initiator is dissolved in a solvent, the solution is agitated for 2 hours at room temperature, a colorant is added thereto, the mixture is agitated for 30 minutes, an acrylic-based binder resin and a photopolymerizable monomer are added thereto, and the resulting mixture is agitated at room temperature.

The solution is three times filtered to remove impurities, obtaining a photosensitive resin composition for a color filter.

TABLE 1

(unit: wt %)

| | | | Example1 | Example2 | Comparative Example1 | Comparative Example2 |
|---|---|---|---|---|---|---|
| (A) Colorant | (A-1) Dye | (A-1-1) | 8 | — | — | — |
| | | (A-1-2) | — | 20 | — | — |
| | (A-2) Pigment | (A-2-1) | 25 | 23 | 23 | 26 |
| | | (A-2-2) | — | — | 10 | — |
| | | (A-2-3) | — | — | — | 17 |
| (B) Acrylic-based binder resin | | | 10 | 7 | 10 | 7 |
| (C) Photopolymerizable monomer | | | 12 | 15 | 12 | 15 |
| (D) Photopolymerization initiator | | | 2 | 3 | 2 | 3 |
| (E) Solvent | | | 43 | 32 | 43 | 32 |

Evaluation: Transmittance, Luminance, and Contrast Ratio of Thin Film

The photosensitive resin compositions for a color filter according to Examples 1 and 2 and Comparative Examples 1 and 2 are respectively coated to be 3.0 to 4.0 μm thick on a 1 mm-thick glass substrate and dried on a hot plate at 90° C. for 1 minute, obtaining each thin film. The thin films are exposed with 100 mJ, dried at 230° C. in a forced convection drying furnace for 30 minutes.

The transmittance, color coordinates (x and y), and luminance (Y) of the thin films according to Examples 1 and 2 and Comparative Examples 1 and 2 are measured by using a spectrophotometer (MCPD3000, Otsuka Electronics Co., Ltd.), and their contrast ratios (CR) were measured by using a measurement device (30,000:1, CT-1, Tsubosaka electronic Co., Ltd.), and then, the results are provided in the following Table 2.

TABLE 2

| | Transmittance | Color coordinate | | Luminance | Contrast |
|---|---|---|---|---|---|
| | (540 nm) | x | y | Y | ratio |
| Example 1 | 93% | 0.275 | 0.567 | 62 | 12000 |
| Comparative Example 1 | 88% | 0.275 | 0.567 | 60 | 10000 |

TABLE 2-continued

| | Transmittance (540 nm) | Color coordinate x | Color coordinate y | Luminance Y | Contrast ratio |
|---|---|---|---|---|---|
| Example 2 | 82% | 0.300 | 0.650 | 48 | 6000 |
| Comparative Example 2 | 75% | 0.300 | 0.650 | 40 | 5000 |

Referring to Table 2, the film according to Example 1 exhibits excellent transmittance, luminance, and contrast ratio compared with the film according to Comparative Example 1. In addition, the film according to Example 2 exhibits excellent transmittance, luminance, and contrast ratio compared with the film according to Comparative Example 2.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A photosensitive resin composition for a color filter, comprising
   (A) a colorant including a dye represented by the following Chemical Formula 1, a dye represented by the following Chemical Formula 2, or a combination thereof;
   (B) an acrylic-based binder resin;
   (C) a photopolymerizable monomer;
   (D) a photopolymerization initiator; and
   (E) a solvent:

[Chemical Formula 1]

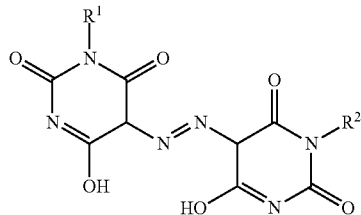

[Chemical Formula 2]

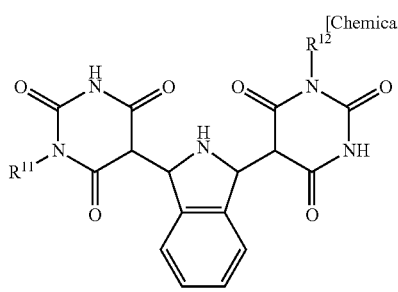

in the above Chemical Formulae 1 and 2, $R^1$, $R^2$, $R^{11}$, and $R^{12}$ are the same or different and are each independently hydrogen, substituted or unsubstituted C1 to C20 alkyl, substituted or unsubstituted C1 to C20 haloalkyl, substituted or unsubstituted C1 to C20 alkoxy, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, substituted or unsubstituted C2 to C30 heteroaryl, or substituted or unsubstituted C2 to C20 ester group, wherein at least one of $R^1$ and $R^2$ is —C(=O)O$R_3$, wherein at least one of $R^{11}$ and $R^{12}$ is —C(=O)O$R_{13}$, and $R_3$ and $R_{13}$ are the same or different and are each independently substituted or unsubstituted C1 to C20 alkyl, substituted or unsubstituted C1 to C20 haloalkyl, substituted or unsubstituted C1 to C20 alkoxy, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl.

2. The photosensitive resin composition for a color filter of claim 1, wherein the colorant (A) further comprises a pigment.

3. The photosensitive resin composition for a color filter of claim 2, wherein the colorant (A) comprises the dye and the pigment in a weight ratio of about 1:9 to about 9:1.

4. The photosensitive resin composition for a color filter of claim 1, wherein the photosensitive resin composition for a color filter comprises:
   about 0.1 to about 60 wt % of the colorant (A);
   about 0.1 to about 30 wt % of the acrylic-based binder resin (B);
   about 0.1 to about 30 wt % of the photopolymerizable monomer (C);
   about 0.1 to about 10 wt % of the photopolymerization initiator (D); and
   a balance amount of the solvent (E).

5. A color filter manufactured using the photosensitive resin composition for a color filter of claim 1.

* * * * *